(12) United States Patent
Wang et al.

(10) Patent No.: US 12,495,540 B2
(45) Date of Patent: Dec. 9, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Luguang Wang, Hefei (CN); Heng-Chia Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 575 days.

(21) Appl. No.: 17/950,992

(22) Filed: Sep. 22, 2022

(65) Prior Publication Data

US 2023/0020650 A1 Jan. 19, 2023

(30) Foreign Application Priority Data

May 31, 2022 (CN) .......................... 202210606136.1

(51) Int. Cl.
H10B 12/00 (2023.01)

(52) U.S. Cl.
CPC ........... H10B 12/482 (2023.02); H10B 12/05 (2023.02); H10B 12/315 (2023.02)

(58) Field of Classification Search
CPC .... H10B 12/482; H10B 12/05; H10B 12/315; H10B 12/485; H10B 12/30;
(Continued)

(56) References Cited

U.S. PATENT DOCUMENTS 6,156,604 A 12/2000 Forbes et al.
7,948,027 B1 5/2011 Renn et al.
(Continued)

FOREIGN PATENT DOCUMENTS

| CN | 101471304 A | 7/2009 |
| CN | 102339831 A | 2/2012 |
| CN | 111785720 A | 10/2020 |

OTHER PUBLICATIONS

ISA State Intellectual Property Office of the People's Republic of China, International Search Report Issued in Application No. PCT/CN2022/106498, Dec. 19, 2022, WIPO, 8 pages.
(Continued)

*Primary Examiner* — Samuel Park
(74) *Attorney, Agent, or Firm* — Kilpatrick Townsend & Stockton LLP

(57) ABSTRACT

Embodiments provide a semiconductor structure and a method for fabricating the same. The semiconductor structure includes: a substrate; bit lines positioned in the substrate, where each of the bit lines includes a conductive body and a dielectric layer, the conductive body includes a body portion and a plurality of contact portions, the body portion extend along a first direction, the contact portions protrude from a side surface of the body portion facing away from a bottom of the substrate, the contact portions are arranged at intervals along the first direction, and the dielectric layer covers side wall surfaces on left and right sides of the body portion along an extension direction; and transistors positioned on top surfaces of the contact portions facing away from the body portion, and extension directions of channels of the transistors are perpendicular to a plane where the substrate is positioned.

14 Claims, 8 Drawing Sheets

(58) Field of Classification Search
CPC ......... H01L 21/76895; H01L 21/76897; H01L 23/5386; H10D 62/115
See application file for complete search history.

(56) References Cited

U.S. PATENT DOCUMENTS

| | | | | |
|---|---|---|---|---|
| 11,152,373 | B1* | 10/2021 | Varghese | H10B 12/488 |
| 2009/0163017 | A1 | 6/2009 | Cho | |
| 2010/0052029 | A1 | 3/2010 | Huang | |
| 2012/0018801 | A1 | 1/2012 | Kobayashi et al. | |
| 2012/0119286 | A1 | 5/2012 | Kim | |
| 2012/0269006 | A1* | 10/2012 | Park | H01L 21/743 |
| | | | | 365/230.01 |
| 2013/0207181 | A1* | 8/2013 | Lee | H10D 30/031 |
| | | | | 257/329 |
| 2014/0061850 | A1* | 3/2014 | Cho | H01L 21/764 |
| | | | | 257/506 |
| 2019/0006376 | A1 | 1/2019 | Ramaswamy | |
| 2019/0288034 | A1 | 9/2019 | Sukekawa | |
| 2021/0351182 | A1* | 11/2021 | Yang | H01L 23/5225 |
| 2023/0371242 | A1* | 11/2023 | Kang | H10B 12/482 |

OTHER PUBLICATIONS

Non-final office action issued in US corresponding U.S. Appl. No. 17/950,229 mailed on Apr. 2, 2025, 6 pages.

* cited by examiner

SEMICONDUCTOR STRUCTURE AND METHOD FOR FABRICATING SAME

CROSS-REFERENCE TO RELATED APPLICATION

This application claims priority to Chinese Patent Application No. 202210606136.1, titled "SEMICONDUCTOR STRUCTURE AND METHOD FOR FABRICATING SAME" and filed to the State Patent Intellectual Property Office on May 31, 2022, the entire contents of which are incorporated herein by reference.

TECHNICAL FIELD

The present disclosure relates to the field of semiconductor integrated circuits, and more particularly, to a semiconductor structure and a method for fabricating the same.

BACKGROUND

As a volatile memory, a dynamic random access memory (DRAM) comprises a plurality of memory cells. Each of the memory cells substantially includes one transistor and one capacitor, and the memory cells are electrically connected to one another by means of word lines (WLs) and bit lines (BLs).

To improve an integration level of the DRAM, a $4F^2$ (where "F" represents a minimum feature size) architecture solution has been proposed to change the transistors in a horizontal direction to the transistors in a vertical direction In such a DRAM, active pillars extending vertically are formed on a substrate, wrap-around gates are formed on outer sides of the active pillars, and buried bit lines and buried word lines are formed. In this way, while reducing a plane size of the DRAM, lengths of channels of the transistors may be maintained, and operating efficiency of the transistors may be improved.

However, as the integration level of the DRAM is increased, the sizes of the transistors are reduced gradually, and the transmission rate of the transistors is limited, which adversely affecting performance of the DRAM.

SUMMARY

In one aspect, the present disclosure provides a semiconductor structure, which includes: a substrate; bit lines positioned in the substrate, where each of the bit lines includes a conductive body and a dielectric layer, the conductive body includes a body portion and a plurality of contact portions, the body portion extends along a first direction, the plurality of contact portions protrude from a side surface of the body portion facing away from a bottom of the substrate, the plurality of contact portions are arranged at intervals along the first direction, and the dielectric layer covers side wall surfaces on left and right sides of the body portion along an extension direction; and transistors positioned on top surfaces of the plurality of contact portions facing away from the body portion, where extension directions of channels of the transistors are perpendicular to a plane where the substrate is positioned.

In another aspect, the present disclosure provides a method for fabricating a semiconductor structure, including: providing a substrate; and forming bit lines, where the bit lines are formed in the substrate, each of the bit lines includes a conductive body and a dielectric layer, the conductive body includes a body portion and a plurality of contact portions, the body portion extend along a first direction, the plurality of contact portions protrude from a side surface of the body portion facing away from a bottom of the substrate, the plurality of contact portions are arranged at intervals along the first direction, and the dielectric layer covers side wall surfaces on left and right sides of the body portion along an extension direction; and forming transistors, where the transistors are formed on top surfaces of the plurality of contact portions facing away from the body portion, and extension directions of channels of the transistors are perpendicular to a plane where the substrate is positioned.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

Figure 1:
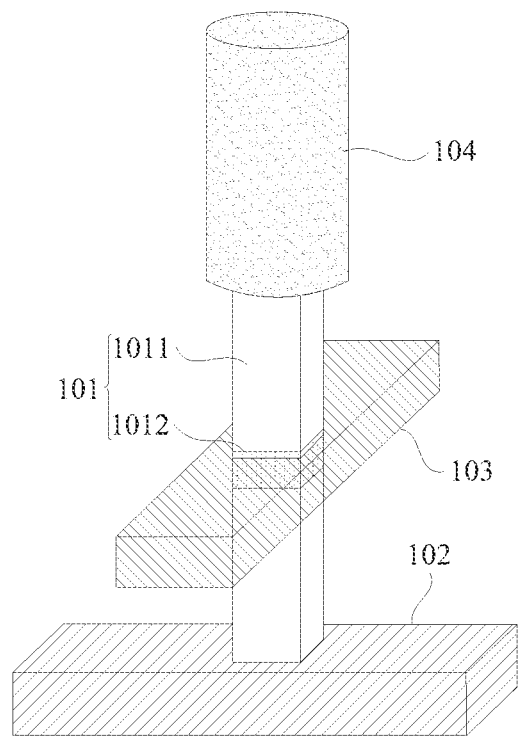
FIG. 1 is a perspective view of one memory cell of a DRAM having vertical channel transistors in the prior art.

Reference numerals in the accompanying drawings:

100—semiconductor structure; 110—substrate; 120—bit line; 130—word line; 140—transistor; 150—capacitor structure; 160—isolation structure; 111—first trench; 112—second trench; 113—semiconductor pillar; 114—metal layer; 121—conductive body; 122—dielectric layer; 141—active pillar; 142—gate structure; 151—contact plug; 161—isolation layer; 162—silicon oxide layer; 163—silicon nitride layer; 1211—body portion; 1212—contact portion; 1221—dielectric material layer; 1411—source; 1412—drain; 1421—gate insulating layer; 1611—initial isolation layer; a—air gap; 101—transistor; 102—bit line; 103—word line; 104—contact plug; 1011—active pillar; and 1012—gate insulating layer.

DETAILED DESCRIPTION

With the increase of an integration level of a semiconductor device, sizes of transistor cells integrated on a substrate of the semiconductor device are gradually reduced, and thus transistors of a $4F^2$ (F represents a minimum feature size) architecture having vertical channels are proposed gradually. An area of the transistor cells having the $4F^2$ architecture may be reduced by about 30% compared with planar transistors having a $6F^2$ architecture.

Taking dynamic random access memory (DRAM) as an example, the DRAM comprises a plurality of memory cells arranged in an array. The memory cells are separated by a plurality of groups of interleaved word lines (WLs) and bit lines (BLs). The memory cells are electrically connected to one another by means of the word lines and the bit lines, and each of the memory cells substantially includes one transistor and one capacitor.

FIG. 1 is a perspective view of one memory cell of the DRAM having vertical channel transistors in the prior art. Referring to FIG. 1, for the memory cells having the $4F^2$ architecture, transistors 101 include active pillars 1011 and gates (not shown in the figure). The active pillars 1011 extend upwards perpendicular to a plane where the substrate (not shown in the figure) is positioned, the gates surround circumferential sides of the active pillars 1011, and gate insulating layers 1012 are provided between the gates and outer wall surfaces of the active pillars 1011. Bit lines 102 are buried into the substrate and are connected to bottoms of the active pillars 1011, and word lines 103 are positioned within a height interval where the active pillars 1011 are positioned and are connected to the gates. Contact plugs 104 are formed at tops of the active pillars 1011, capacitors (not shown in the figure) are formed on the contact plugs 104, and the capacitors are electrically connected to the active pillars 1011 by means of the contact plugs 104.

However, in the existing DRAM having the $4F^2$ architecture, resistances of the bit lines 102 are higher, and there is a larger parasitic capacitance between the bit lines 102, which limits a transmission rate of the transistors 101, and thus adversely affects performance of the DRAM.

On this account, embodiments of the present disclosure provide a semiconductor structure and a method for fabricating the same. In the semiconductor structure, the bit lines are set to be in a manner of a conductive body and a dielectric layer. The conductive body includes contact portions protruding from the body portion. The contact portions increase volumes of the bit lines, deepen buried depths of the bit lines, reduce the resistances of the bit lines, and increase the transmission rate of the transistors. Moreover, by forming the dielectric layer on two sides of the body portion, electrical conductivity of the bit lines and performance of electrical isolation between the bit lines may be enhanced, and it is beneficial to form an air gap between the bit lines, such that the parasitic capacitance between the bit lines is effectively reduced, and thus the performance of the semiconductor structure is improved.

To make the objectives, technical solutions, and advantages of the embodiments of the present disclosure clearer, the technical solutions in the embodiments of the present disclosure will be described clearly and completely below, in conjunction with the accompanying drawings in the embodiments of the present disclosure. Apparently, the described embodiments are some but not all of the embodiments of the present disclosure. All other embodiments obtained by those of ordinary skills in the art based on the embodiments of the present disclosure without creative efforts shall fall within the protection scope of the present disclosure.

This embodiment provides a semiconductor structure, which may be a memory device or a non-memory device. The memory device may include, for example, dynamic random access memory (DRAM), static random access memory (SRAM), flash memory, electrically erasable programmable read-only memory (EEPROM), phase change random access memory (PRAM) or magnetoresistive random access memory (MRAM). The non-memory device may be a logic device (e.g., microprocessors, digital signal processors, or microcontrollers) or similar devices. Descriptions are made below by taking an example where the semiconductor structure is the DRAM.

Figure 2:
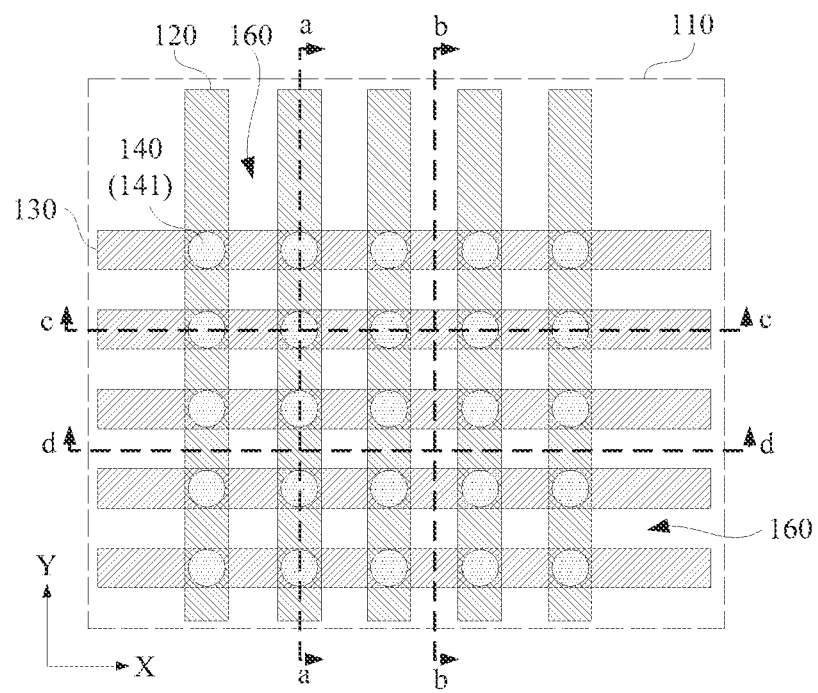
FIG. 2 is a birds-eye perspective of a substrate a semiconductor structure according to an embodiment of the present disclosure.
Figure 3:
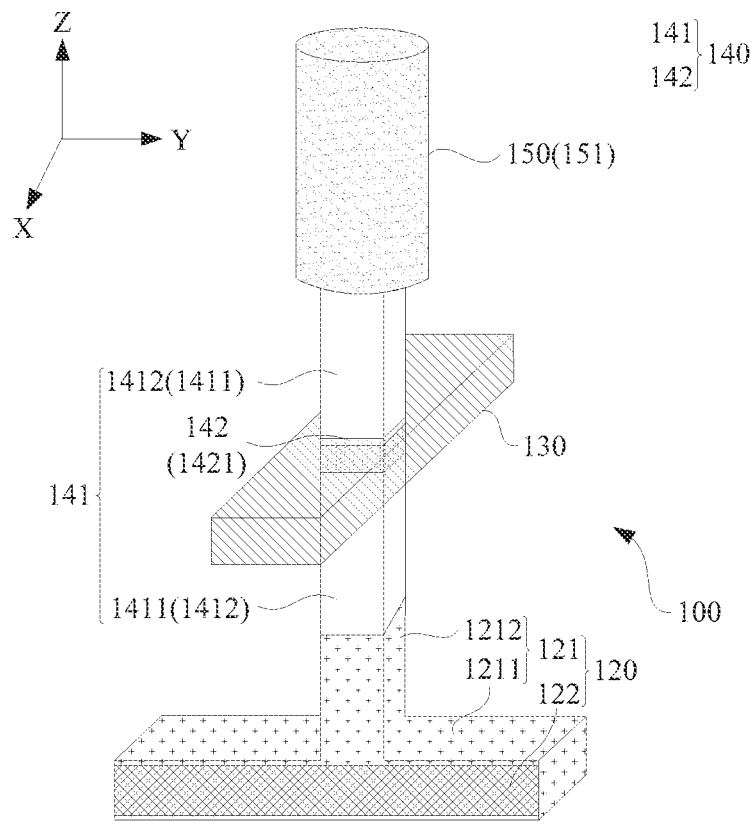
FIG. 3 is a stereo perspective view of the semiconductor structure according to an embodiment of the present disclosure.
Figure 4:
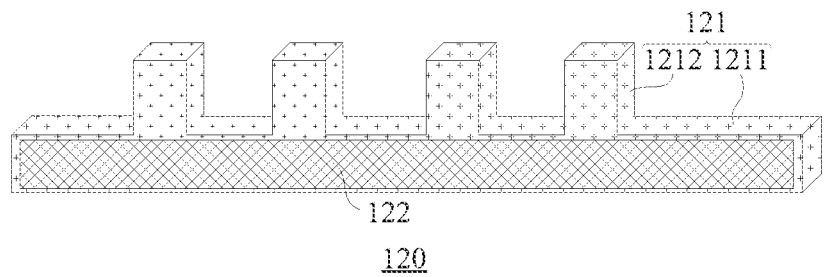
FIG. 4 is a schematic structural diagram of a bit line according to an embodiment of the present disclosure.
Figure 5:
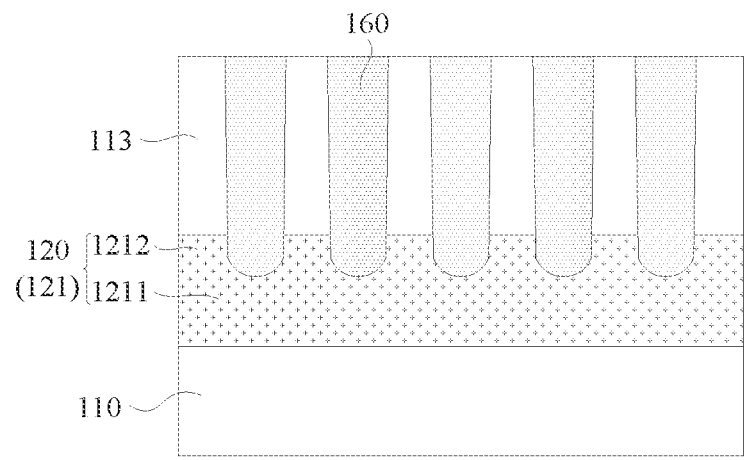
FIG. 5 is a sectional view corresponding to a-a of the semiconductor structure in FIG. 2.
Figure 6A:
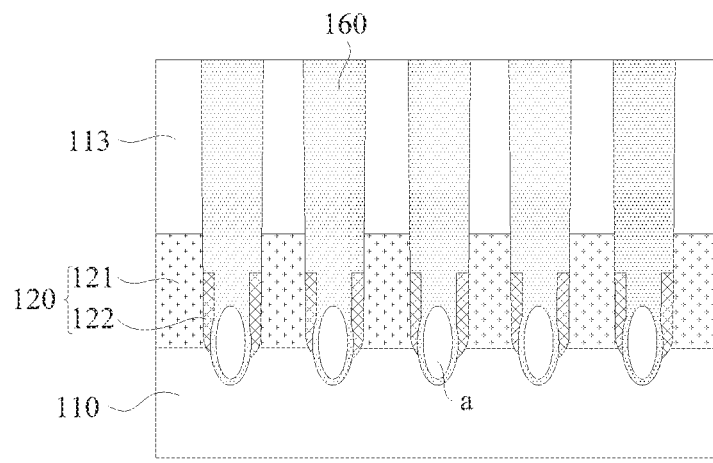
FIG. 6*a* is a sectional view corresponding to c-c of the semiconductor structure in FIG. 2.
Figure 6B:
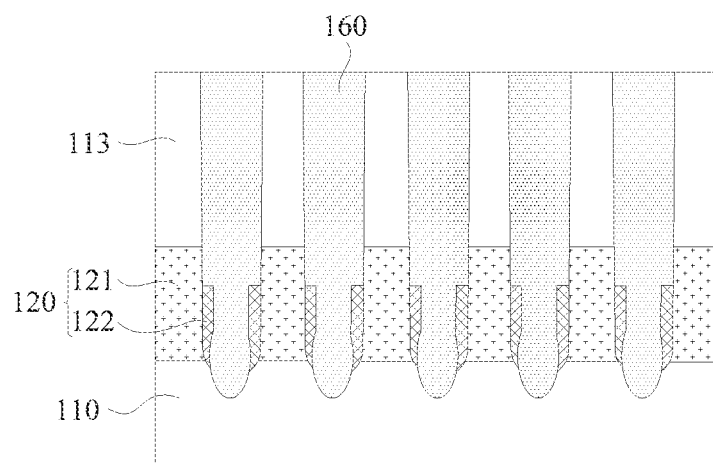
FIG. 6*b* is a sectional view corresponding to c-c of another semiconductor structure in FIG. 2.

FIG. 2 is a birds-eye perspective of a substrate a semiconductor structure according to an embodiment of the present disclosure; FIG. 3 is a stereo perspective view of the semiconductor structure according to an embodiment of the present disclosure; FIG. 4 is a schematic structural diagram of a bit line according to an embodiment of the present disclosure; FIG. 5 is a sectional view corresponding to a-a of the semiconductor structure in FIG. 2; FIG. 6a is a sectional view corresponding to c-c of the semiconductor structure in FIG. 2; and FIG. 6b is a sectional view corresponding to c-c of another semiconductor structure in FIG. 2.

Referring to FIG. 2, the semiconductor structure 100 includes a substrate 110, which generally is a semiconductor substrate. Materials constituting the substrate 110 may include one or more of monocrystalline silicon, polycrystalline silicon, amorphous silicon, silicon germanium compound or silicon-on-insulator (SOD, or the materials constituting the substrate 110 may also be other materials known to those skilled in the art.

A plurality of buried bit lines 120 and word lines 130 are formed in the substrate 110. The bit lines 120 are parallel to one another, the bit lines 120 extend along a first direction, and the bit lines 120 may be arranged at equal intervals. Similar to the bit lines 120, the word lines 130 are parallel to one another, the word lines 130 extend along a second direction, and the word lines 130 may be arranged at equal intervals. The substrate 110 is divided into a plurality of regions arranged in array by means of the bit lines 120 and the word lines 130, and these regions correspond to the memory cells of the DRAM. The first direction intersects with the second direction. For example, the first direction and the second direction may be perpendicular to each other. The first direction is, for example, a direction Y in FIG. 2, and the second direction is, for example, a direction X in FIG. 2.

Still referring to FIG. 2, the transistors 140 are also formed in the substrate 110. For the transistors 140 having vertical channels, the transistors 140 generally include the active pillars 141 and gate structures surrounding the active pillars 141 (not shown in the figure). The active pillars 141 extend along a direction perpendicular to a plane direction of the substrate 110. That is, the active pillars 141 extend towards the top surface of the substrate 110 along a thickness direction of the substrate 110, and the gate structures surround the circumferential sides of the active pillars 141.

It should be noted that, in the thickness direction of the substrate 110, the bit lines 120 are generally positioned at a same level, and the word lines 130 are generally positioned at a same level height. Moreover, the bit lines 120 and the word lines 130 are generally positioned within different height intervals, the bit lines 120 and the word lines 130 are isolated from each other, and the adjacent bit lines 120 and the adjacent word lines 130 are also isolated from each other, to control operation of each memory cell by means of the bit lines 120 and the word lines 130.

In addition, in this embodiment, the active pillars 141 may be formed in an overlapping region between the bit lines 120 and the word lines 130, to facilitate the connection between the bit lines 120/word lines 130 and the transistors 140.

Referring to FIG. 3, in some embodiments, along the thickness direction of the substrate 110 (a direction Z in the figure), the active pillars 141 are arranged on the bit lines 120, the bottoms of the active pillars 141 are in contact with the bit lines 120, and the active pillars 141 protrude upward vertically. Capacitor structures 150 of the DRAM are provided at the tops of the active pillars 141, and the capacitor structures 150 include contact plugs 151 and capacitors (not shown in the figure). The contact plugs 151 are positioned at the tops of the active pillars 141 and are in contact with the active pillars 141, the capacitors are generally arranged on the contact plugs 151, and the capacitors are electrically connected to the active pillars 141 by means of the contact plugs 151.

The word lines 130 are arranged above the bit lines 120, and the word lines 130 are positioned in a height region where the active pillars 141 are positioned. The word lines 130 may be arranged corresponding to the active pillars 141. For example, the active pillars 141 may pass through the word lines 130, such that the word lines 130 are connected to the gate structures 142 surrounding the outer peripheries of the active pillars 141.

Referring to FIG. 2 and FIG. 3, in this embodiment, by providing the transistors 140 having the vertical channels, the planar sizes of the transistors 140 may be reduced, and space occupied by the transistors 140 in the substrate 110 may be effectively reduced, thereby increasing density of the transistors 140 in the substrate 110, and increasing the integration level of the DRAM. In addition, by setting the gate structures 142 as structures annularly arranged on the circumferential sides, the overlapping region between the gate structures 142 and the channels of the active pillars 141 may be increased, and gate control capability of the transistors 140 may be improved.

The active pillars 141 may include sources 1411, channels (not shown in the figure), and drains 1412. The sources 1411, the channels, and the drains 1412 are arranged in sequence along the length directions of the active pillars 141. For example, the sources 1411, the channels, and the drains 1412 are sequentially from the bottoms to the tops of the active pillars 141; or, the drains 1412, the channels, and the sources 1411 are sequentially from the bottoms to the tops of the active pillars 141. The following description will be given by taking an example where the sources 1411, the channels, and the drains 1412 are sequentially from the bottoms to the tops of the active pillars 141.

The gate structures 142 surround outer peripheries of parts where the channels of the active pillars 141 are positioned, and the gate structures 142 include gate insulating layers 1421 and gates (not shown in the figure) sequentially stacked on the outer side walls of the active pillars 141. The gate insulating layers 1421 are in contact with the outer wall surfaces of the channels, and the gates are positioned between the word lines 130 and the gate insulating layers 1421.

That is, the sources 1411 of the transistors 140 are connected to the bit lines 120, the drains 1412 of the transistors 140 are connected to the capacitor structures 150, and the gates of the transistors 140 are connected to the word lines 130. Word line 130 drivers are generally provided in the DRAM. The word lines 130 are connected to the word line 130 drivers, the word line 130 drivers input a voltage signal into the word lines 130, and the voltage signal of the word lines 130 acts on the gates. The sources 1411 and the drains 1412 of the active pillars 141 are turned on by means of the gates, such that the transistors 140 are turned on to connect the bit lines 120 and the capacitor structures 150. Data stored in the capacitors are read by means of the bit lines 120; or the data are written, by means of the bit lines 120, into the capacitors for storage.

In practical applications, by designing a forming process for the gate structures 142, the gate structures 142 may surround part of the circumferential sides of the active pillars 141, and the gate structures 142 are semicircular structures. For example, the gate structures 142 surround part of the regions on the outer side walls of the channels of the active pillars 141, and the outer side walls of other part of the regions of the channels of the active pillars 141 may be exposed outside the gate structures 142. In some embodiments, as shown in FIG. 3, the gate structures 142 may form annular structures completely surrounding the circumferential sides of the channels of the active pillars 141 to form gate-all-around (GAA) structures. Corresponding to the gate structures 142, the word lines 130 may half surround the circumferential sides of the active pillars 141; or, as shown in FIG. 3, the word lines 130 may completely surround the circumferential sides of the active pillars 141. The active pillars 141 pass through middle regions of the word lines 130 in the width direction.

In addition, to ensure the insulating effect of the gate insulating layers 1421 and avoid occurrence of leakage current of the gates, the extension height of the gate insulating layers 1421 may be greater than that of the gates, and the gates are positioned within a coverage region of the gate insulating layers 1421. For example, at least one side of the gate insulating layers 1421 may be exposed outside the word lines 130.

Referring to FIG. 4, in this embodiment, the bit lines 120 include conductive bodies 121. The conductive bodies 121 include body portions 1211 and a plurality of contact portions 1212. The contact portions 1212 protrude from side surfaces of the body portions 1211 facing away from the bottom of the substrate 110. That is, the contact portions 1212 protrude from the top surfaces of the body portions 1211, and the contact portions 1212 protrude, for example, vertically toward the top surface of the substrate 110. Referring to FIG. 3, the active pillars 141 of the transistors 140 are arranged on the contact portions 1212, and the bottoms of the active pillars 141 are in contact with the tops of the contact portions 1212. Referring to FIG. 2, the body portions 1211 of the bit lines 120 extend along the first direction (direction Y), and the contact portions 1212 are arranged at intervals along the first direction. That is, the contact portions 1212 are arranged at intervals along the extension direction of the bit lines 120, the contact portions 1212 are in one-to-one correspondence to the active pillars 141, and the active pillars 141 are all positioned at the tops of the corresponding contact portions 1212, to ensure that the active pillars 141 are positioned within a same level region.

Referring to FIG. 3, by setting the conductive bodies 121 of the bit lines 120 into a structural form including the body portions 1211 and the contact portions 1212. The contact portions 1212 protrude from the top surfaces of the body portions 1211, and the bottoms of the active pillars 141 are in contact with the tops of the contact portions 1212. Compared with the conventional bit lines 120 (such as the bit lines 120 shown in FIG. 1), in this embodiment, the volume of the bit lines 120 is increased by additionally providing the contact portions 1212 on the body portions 1211. Moreover, the contact portions 1212 are spaced apart between the body portions 1211 and the active pillars 141, which increases pitches between the body portions 1211 and the active pillars 141, such that the resistances of the bit lines 120 may be reduced.

The speed at which the data are written into or read from the capacitors depends on the resistances of the bit lines 120. The lower the resistances of the bit lines 120 are, the faster the data transmission speed is. Therefore, in this embodiment, by providing the contact portions 1212, the volume of the bit lines 120 is increased, and the resistances of the bit lines 120 are reduced, thereby increasing the data transmission speed of the memory cells in the DRAM, and improving the performance of the DRAM.

Referring to FIG. 5, which shows a sectional view corresponding to a-a of the semiconductor structure in FIG. 2, the bit lines 120 shown in the figure are cross-sectional structures along the extension direction thereof. As can be seen, the bit lines 120 are formed in the substrate 110, the bit lines 120 include the body portions 1211 extending along the extension direction thereof and the plurality of contact portions 1212 protruding from the body portions 1211, and the contact portions 1212 are arranged at intervals along the extension direction of the bit lines 120.

In practical applications, initial semiconductor pillars 113 may be formed first in the substrate 110, and then, by processing the substrate 110, the bit lines 120 are formed in the substrate 110. The bit lines 120 include substrate 110 regions (body portions 1211) positioned below the semiconductor pillars 113 and bottom regions (contact portions 1212) of the semiconductor pillars 113. Next, the semiconductor pillars 113 may be formed into the active pillars 141 by means of doping, for example. Taking an example where the substrate 110 is an N-type doped silicon substrate, the active pillars 141 may be formed by performing P-type doping on the semiconductor pillars 113.

Referring to FIG. 4, on the basis that the conductive bodies 121 of the bit lines 120 include the body portions 1211 and the contact portions 1212 protruding from the body portions 1211, the bit lines 120 in this embodiment further include dielectric layers 122, where the dielectric layers 122 cover left and right sides of the body portions 1211 in the extension direction. That is, the dielectric layers 122 cover two sides of the bit lines 120 in the extension direction. As shown in FIG. 2, the dielectric layers 122 cover the opposite sides of the body portions 1211 between the adjacent bit lines 120. In this way, on the basis of an isolation structure 160 between the bit lines 120, the dielectric layers 122 on two sides of the isolation structure 160 may enhance the electrical conductivity of the bit lines 120 and the isolation performance between the bit lines 120, reduce the parasitic capacitance between the bit lines 120, and weaken a coupling effect between the bit lines 120, to prevent from causing read/write time delay of the DRAM, and thus improving the performance of the DRAM.

Referring to FIG. 6a, as an embodiment, there may be an air gap a between the adjacent bit lines 120, and the air gap a may be, for example, positioned in a region between the body portions 1211 of the adjacent bit lines 120. because the dielectric layers 122 cover the side wall surfaces of the body portions 1211 of the bit lines 120 facing the adjacent bit lines 120, and the dielectric layers 122 covered on the opposite sides of the adjacent bit lines 120 reduce the width of a gap between the adjacent bit lines 120, it is easy to form the air gap a in the region between the body portions 1211 of the adjacent bit lines 120 in the process of forming the isolation structure 160 between the bit lines 120.

By forming the air gap a between the bit lines 120, on the basis that the dielectric layers 122 cover the side wall surfaces of the bit lines 120, the air gap a may further enhance the isolation effect between the bit lines 120, reduce the parasitic between the bit lines 120, and weaken the coupling effect between the bit lines 120. In addition, the air gap a may also absorb the stress in the substrate 110 to reduce lattice defects in structural layers such as the bit lines 120, the word lines 130, and the transistors 140 in the substrate 110, thereby improving the performance of the DRAM.

For example, when the isolation structure 160 between the bit lines 120 is formed, the air gap a may be formed between the body portions 1211 of the adjacent bit lines 120 by increasing the speed of depositing an isolation material.

Referring to FIG. 6b, as another embodiment, when only the dielectric layers 122 on the side wall surfaces of the bit lines 120 may achieve a good isolation effect between the bit lines 120, there may be no air gap a between the adjacent bit lines 120. At this moment, when the isolation structure 160 between the bit lines 120 is formed, the deposition uniformity of the isolation material may be improved by reducing the speed of depositing the isolation material, such that the isolation material completely fills the gap between the bit lines 120.

In addition, the dielectric layers 122 covering the side wall surfaces of the body portions 1211 may be insulating layers, and the dielectric layers 122 mainly achieve the effects of improving the isolation performance between the bit lines 120 and reducing unnecessary parasitic capacitance between the bit lines 120. The dielectric layers 122 may be made of a material with a lower dielectric constant. For example, the material constituting the dielectric layers 122 may be SiN, SiON, or SiCN.

For example, the dielectric layers may include single-layer conductor layers. For example, the dielectric layers 122 may be SiN layers or SiON layers. The dielectric layers 122 may also be multilayer insulating layers sequentially stacked on the side wall surfaces of the body portions 1211 of the bit lines 120. Materials of the adjacent insulating layers may be the same or may be different, which is not limited in this embodiment.

In some other embodiments, the dielectric layers 122 may be conductor layers. By covering the side wall surfaces of the body portions 1211 with the conductor layers, it is equivalent to increasing the volume of the conductive bodies 121 of the bit lines 120, such that the electrical conductivity of the bit lines 120 may be enhanced. For example, the dielectric layers 122 may include single-layer conductor layers. For example, the dielectric layers 122 may be tungsten layers, TiN layers, or other metal layers; or, the dielectric layers 122 may also be multilayer conductor layers sequentially stacked on the side wall surfaces of the body portions 1211. The materials of the adjacent conductor layers may be the same or different.

In other embodiments, the dielectric layers 122 may also be composite layers, and the composite layers include conductor layers and insulating layers sequentially stacked on the side wall surfaces of the body portions 1211. It is to be understood that main function of the insulating layer covering the outermost side of the side wall surfaces of the body portions 1211 is still to improve the isolation performance between the bit lines 120 and reduce the parasitic capacitance between the bit lines 120. By additionally providing the conductor layers between the isolation layers 161 and the side wall surfaces of the body portions 1211, the conductor layers are, for example, metal layers 114 made of metal such as tungsten or aluminum. The conductor layers increase the volume of the conductive bodies 121 and enhance the electrical conductivity of the bit lines 120.

On the basis of the above embodiments, an embodiment of the present disclosure further provides a method for fabricating a semiconductor structure 100 (hereinafter referred to as the fabrication method), and the fabrication method is configured for fabricating the aforementioned semiconductor structure 100. The fabrication method will be described in detail below.

Figure 7:
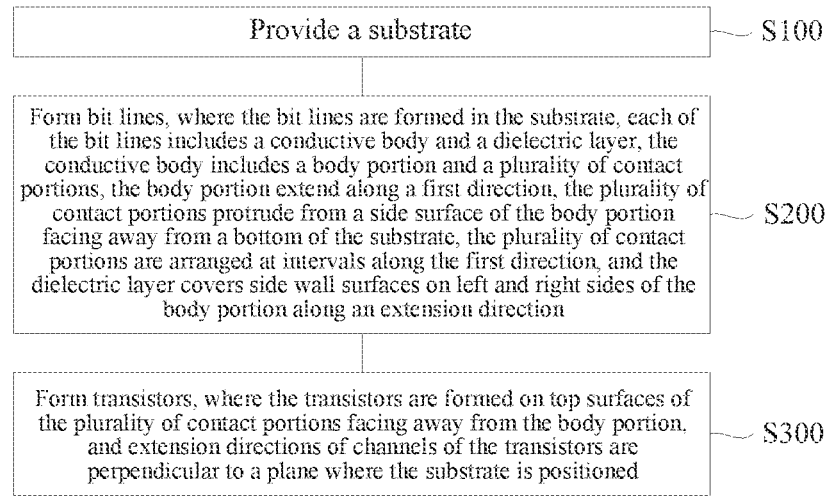
FIG. 7 is a flowchart showing steps of a method for fabricating a semiconductor structure according to an embodiment of the present disclosure.
Figure 8:
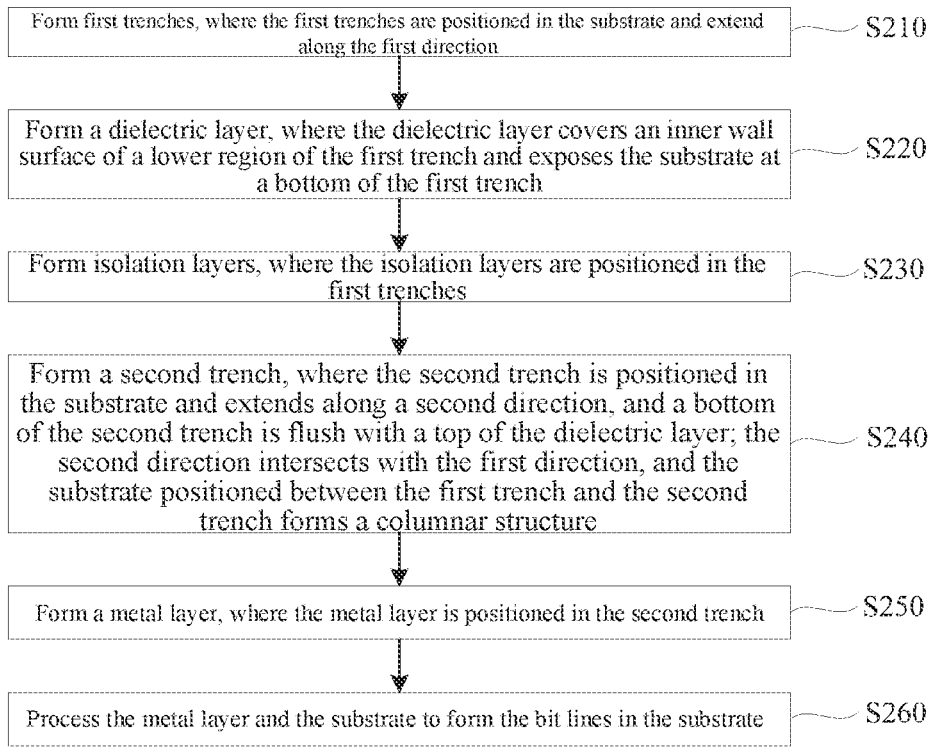
FIG. 8 is a flowchart showing steps of forming a bit line according to an embodiment of the present disclosure.
Figure 9:
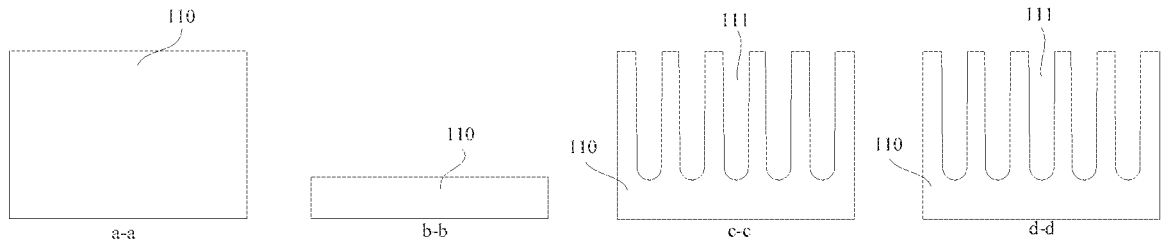
FIG. 9 is a sectional view of forming a first trench in the substrate in FIG. 2.

FIG. 7 is a flowchart showing steps of the method for fabricating the semiconductor structure according to an embodiment of the present disclosure; FIG. 8 is a flowchart showing steps of forming a bit line according to an embodiment of the present disclosure; and FIG. 9 is a sectional view of forming a first trench in the substrate in FIG. 2.

Referring to FIG. 7, the fabrication method includes following steps.

S100: providing a substrate.

First, as shown in FIG. 8, a substrate 110 having a certain thickness is provided, where the substrate 110 may be a semiconductor substrate. Materials constituting the substrate 110 may include one or more of monocrystalline silicon, polycrystalline silicon, amorphous silicon, silicon germanium compound or silicon-on-insulator (SOI), or the materials constituting the substrate 110 may also be other materials known to those skilled in the art.

S200: forming bit lines, where the bit lines are formed in the substrate, each of the bit lines includes a conductive body and a dielectric layer, the conductive body includes a body portion and a plurality of contact portions, the body portion extend along a first direction, the plurality of contact portions protrude from a side surface of the body portion facing away from a bottom of the substrate, the plurality of contact portions are arranged at intervals along the first direction, and the dielectric layer covers side wall surfaces on left and right sides of the body portion along an extension direction.

Referring to FIG. 3, after the substrate 110 is formed, the bit lines 120 are formed in the substrate 110, and the formed bit lines 120 include the conductive bodies 121 and the dielectric layers 122. The conductive bodies 121 include the body portions 1211 and the plurality of contact portions 1212. The body portions 1211 extend along the extension direction of the bit lines 120 (the direction Y in FIG. 2). The contact portions 1212 are formed on the top surfaces of the body portions 1211 facing away from the bottom of the substrate 110, and the contact portions 1212 are arranged at intervals along the extension direction of the body portions 1211, such that the active pillars 141 are formed at the tops of the contact portions 1212 in one-to-one correspondence. The dielectric layers 122 are formed on the left and right side wall surfaces of the body portions 1211 in the extension direction. That is, the dielectric layers 122 are formed on the side wall surfaces of the opposite sides of the body portions 1211 of the adjacent bit lines 120.

Figure 10:
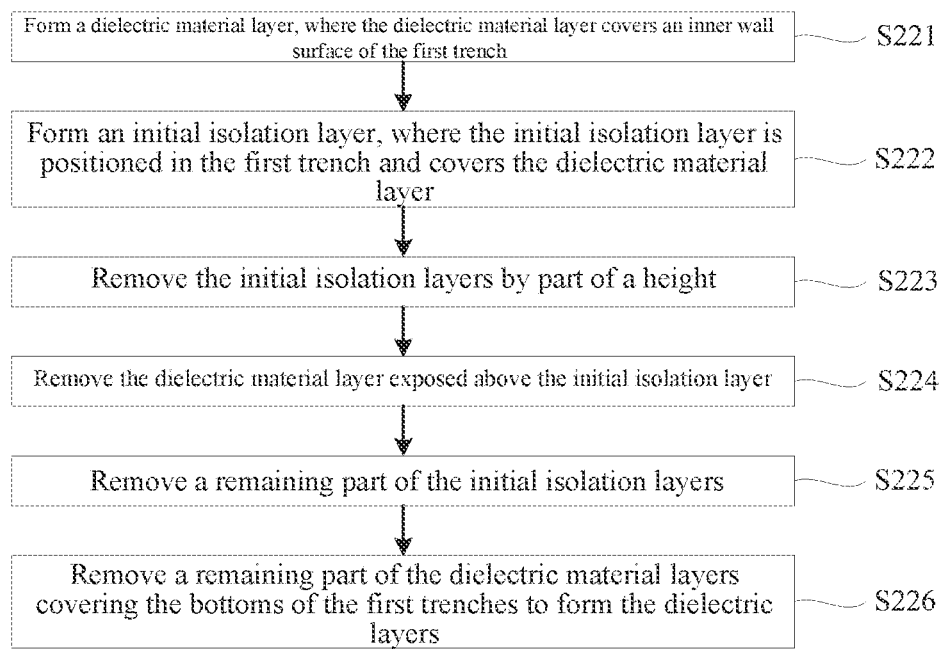
FIG. 10 is a flowchart showing steps of forming a dielectric layer according to an embodiment of the present disclosure.
Figure 11:
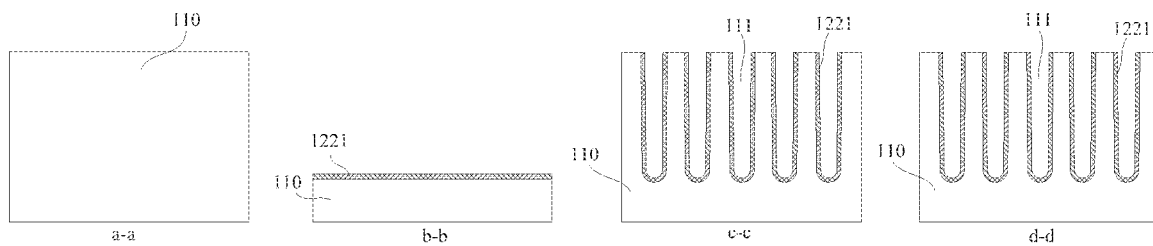
FIG. 11 is a sectional view of forming a dielectric material layer in the substrate in FIG. 2.
Figure 12:
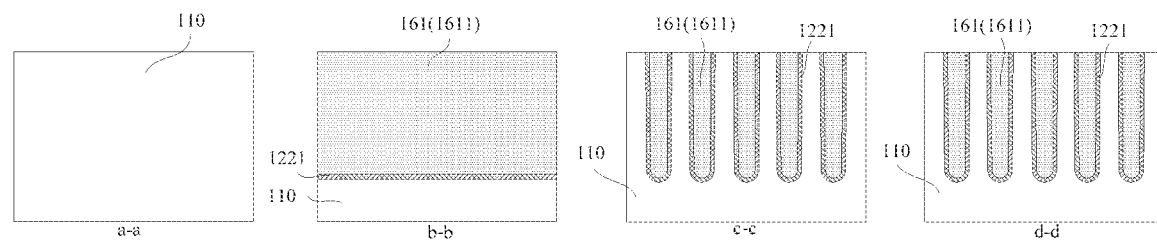
FIG. 12 is a sectional view of forming an initial isolation layer in the substrate in FIG. 2.
Figure 13:
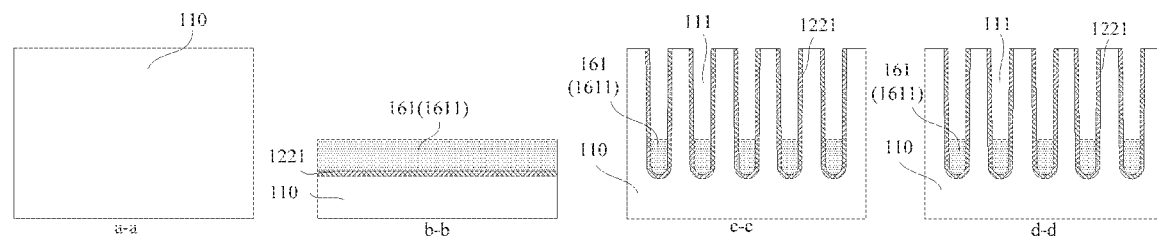
FIG. 13 is a sectional view of the initial isolation layer removed by part of height from the substrate in FIG. 2.
Figure 14:
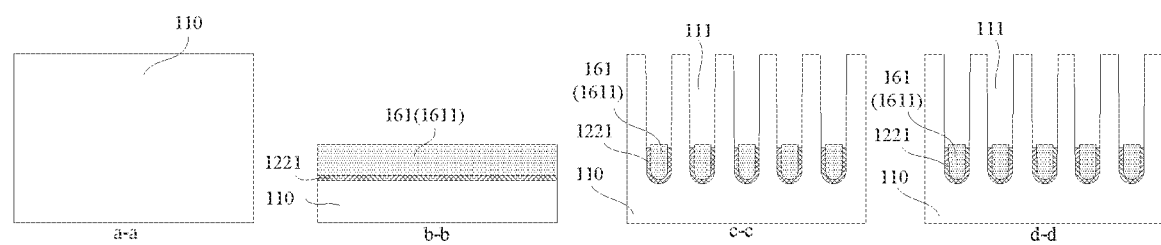
FIG. 14 is a sectional view of removing a dielectric material layer exposed on the initial isolation layer from the substrate in FIG. 2.
Figure 15:
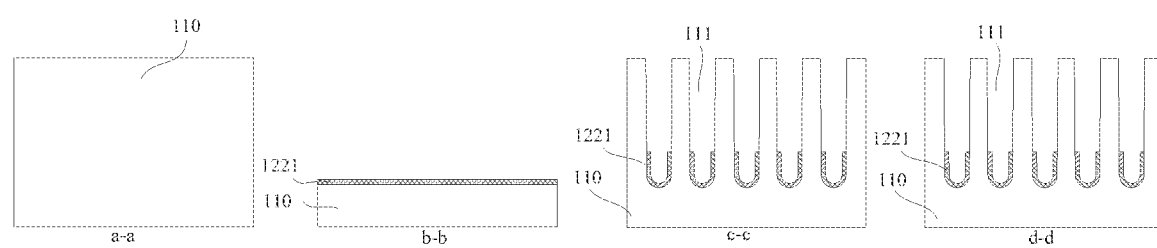
FIG. 15 is a sectional view of removing remaining part of the initial isolation layer from the substrate in FIG. 2.
Figure 16:
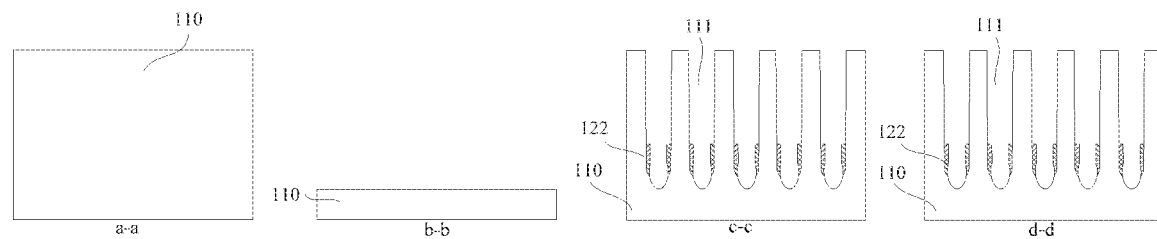
FIG. 16 is a sectional view of forming a dielectric layer in the substrate in FIG. 2.

FIG. 10 is a flowchart showing steps of forming a dielectric layer according to an embodiment of the present disclosure; FIG. 11 is a sectional view of forming a dielectric material layer in the substrate in FIG. 2; FIG. 12 is a sectional view of forming an initial isolation layer in the substrate in FIG. 2; FIG. 13 is a sectional view of the initial isolation layer removed by part of height from the substrate in FIG. 2; FIG. 14 is a sectional view of removing the dielectric material layer exposed on the initial isolation layer from the substrate in FIG. 2; FIG. 15 is a sectional view of removing remaining part of the initial isolation layer from the substrate in FIG. 2; and FIG. 16 is a sectional view of forming the dielectric layer in the substrate in FIG. 2.

Referring to FIG. 8, the forming the bit lines 120 includes:

S210: forming first trenches, where the first trenches are positioned in the substrate and extend along the first direction.

Referring to FIG. 9, after the substrate 110 is formed, the first trenches 111 are first formed in the substrate 110 by etching, where the first trenches 111 extend along the first direction. That is, the first trenches 111 extend along the extension direction of the bit lines 120. The first trenches 111 are positioned in a region between the adjacent bit lines 120, to form initial structures of the bit lines 120 in a region of the substrate 110 that is not etched and is retained.

It should be noted that, from left to right in FIG. 9, there are sectional views of positions a-a, b-b, c-c and d-d in FIG. 2, and the subsequent sectional views are similar to these sectional views, which are not described again herein.

S220: forming a dielectric layer, where the dielectric layer covers an inner wall surface of a lower region of the first trench and exposes the substrate at a bottom of the first trench;

Referring to FIG. 10, after the first trench 111 is formed in the substrate 110, the dielectric layer 122 of the bit line 120 is formed in the first trench 111, and after the dielectric layer 122 is formed, the conductive body 121 is formed in the bit line 120.

The dielectric layers 122 formed cover the inner wall surfaces of the lower regions of the first trenches 111, and the bottoms of the first trenches 111 are not covered with the dielectric layers 122 to expose the substrate 110 positioned at the bottoms of the first trenches 111, such that the regions covered with the dielectric layers 122 correspond to the side wall surfaces of the body portions 1211 of the conductive bodies 121 formed subsequently.

The forming the dielectric layer 122 includes following steps.

S221: forming a dielectric material layer, where the dielectric material layer covers an inner wall surface of the first trench.

Referring to FIG. 11, after the first trenches 111 are formed in the substrate 110, entire dielectric material layers 1221 are first deposited on the inner wall surfaces of the first trenches 111 by means of a process such as an atomic layer deposition (ALD) process, a physical vapor deposition (PVD) process, or a chemical vapor deposition (CVD) process. Because the dielectric material layers 1221 are thin-layer structures covering the inner wall surfaces of the first trenches 111, the ALD process with good linear coverage may be selected to deposit the dielectric material layers 1221.

Taking an example where the dielectric layers 122 are the aforementioned single-layer insulating layers, the dielectric material layers 1221 may be formed by one-time deposition. For example, SiN layers are deposited on the inner wall surfaces of the first trenches 111 to form the dielectric material layers 1221. Taking an example where the dielectric layers 122 are the aforementioned single-layer conductor layers, the dielectric material layers 1221 may also be formed by means of one-time deposition. For example, TiN layers are deposited on the inner wall surfaces of the first trenches 111 to form the dielectric material layers.

Taking an example where the dielectric layers 122 are the aforementioned composite layers, for example, the dielectric layers 122 include multilayer insulating layers stacked in sequence, and the insulating layers may be formed sequentially by means of multiple depositions. For example, the SiN layers are first deposited on the inner wall surfaces of the first trenches 111, and then the SiON layers are deposited on the SiN layers to form the dielectric material layers 1221 composited by the SiN layers and the SiON layers. In some embodiments, the dielectric layers 122 include multilayer conductor layers stacked in sequence, and the conductor layers may be sequentially formed by means of multiple depositions. For example, the tungsten layers are first deposited on the inner wall surfaces of the first trenches 111, and then the TiN layers are deposited on the tungsten layers to form the dielectric material layers composited by the tungsten layers and the TiN layers.

In some embodiments, the dielectric layers 122 include the conductor layers and the insulating layers sequentially stacked on the side wall surfaces of the body portions 1211, where the conductor layers and the insulating layers may be sequentially formed by means of multiple depositions. For example, the tungsten layers or aluminum layers are first deposited on the inner wall surfaces of the first trenches 111 as the conductor layers, and then the SiON layers are deposited on the conductor layers as the insulating layers to form the dielectric material layers 1221 composited by the conductor layers and the insulating layers.

S222: forming an initial isolation layer, where the initial isolation layer is positioned in the first trench and covers the dielectric material layer.

Referring to FIG. 12, after the dielectric layers 122 covering the inner wall surfaces of the first trenches 111 are formed in the first trenches 111, initial isolation layers 1611 are formed in the first trenches 111. Material constituting initial material layers is, for example, $SiO_2$, and the first trenches 111 may be filled with $SiO_2$ by means of spin coating.

It should be noted that, after the dielectric material layers 1221 are formed, the initial isolation layers 1611 fill the first trenches 111 for the convenience of defining the dielectric material layers 1221 that need to be retained later to form the dielectric layers 122 having a required height.

S223: removing the initial isolation layers by part of a height.

Referring to FIG. 13, after the initial isolation layers 1611 fill up the first trenches 111, the initial isolation layers 1611 are etched, such that the initial isolation layers 1611 are removed by part of the height. That is, the height of the initial isolation layers 1611 is reduced. The initial isolation layers 1611 positioned at the lower parts of the first trenches 111 are retained, such that the remaining part of the initial isolation layers 1611 define the height of the dielectric material layers 1221 needing to be retained.

The height of the remaining part of the initial isolation layers 1611 may account for $1/10$ to $1/2$ of the depth of the first trenches 111. For example, the height of the remaining part of the initial isolation layers 1611 is $1/4$, $1/5$, $1/6$, $1/7$, $1/8$ or $1/9$ of the depth of the first trenches 111. In this way, the dielectric material layers 1221 are subsequently etched according to the remaining part of the initial isolation layers 1611, such that the retained height region of the dielectric material layers 1221 may correspond to the height region of the body portions 1211 formed subsequently.

Wet etching may be used for etching of the initial isolation layers 1611. For example, hydrofluoric acid may be selected as an etchant for the wet etching, to remove the initial isolation layers 1611 by part of the height, without having an obviously negative effect on the dielectric material layers 1221. In some embodiments, dry etching may also be used, and an etching selectivity may be defined to ensure that only the initial isolation layers 1611 are etched, and the dielectric material layers 1221 are not etched or etched very slowly.

S224: removing the dielectric material layer exposed above the initial isolation layer.

Referring to FIG. 14, after the initial isolation layers 1611 are removed by part of the height, the exposed dielectric material layers 1221 covering the inner side walls of the first trenches 111 are then removed. For example, the dielectric material layers 1221 exposed above the initial isolation layers 1611 may be etched using phosphoric acid as the etchant by means of the wet etching, and the dielectric material layers 1221 positioned at the lower parts of the first trenches 111 are retained, such that the remaining part of the dielectric material layers 1221 correspond to the body portions 1211 formed subsequently.

It should be noted that, when the dielectric material layers 1221 are etched, etching time may be slightly prolonged to overetch part of the dielectric material layers 1221, such that the tops of the remaining part of the dielectric material layers 1221 are lower than the top surfaces of the initial isolation layers 1611. In this way, it may be ensured that the remaining part of the dielectric material layers 1221 are completely positioned within the coverage region of the side wall surfaces of the body portions 1211 formed subsequently, to prevent the dielectric layers 122 from adversely affecting other structural layers in the substrate 110.

S225: removing a remaining part of the initial isolation layers.

Referring to FIG. 15, after the dielectric material layers 1221 are etched to a preset height, the remaining part of the initial isolation layers 1611 in the first trenches 111 are then removed, such that the dielectric material layers 1221 are completely exposed in the first trenches 111. The initial isolation layers 1611 may be etched by means of the wet etching or the dry etching as described in S223 to remove all the initial isolation layers 1611, which is not described again herein.

S226: removing a remaining part of the dielectric material layers covering the bottoms of the first trenches to form the dielectric layers.

Referring to FIG. 16, after only the dielectric material layers 1221 are retained in the first trenches 111, the dielectric material layers 1221 covering the bottoms of the first trenches 111 may be removed by means of the dry etching to expose the substrate 110 positioned at the bottoms of the first trenches 111, such that the dielectric material layers 1221 only cover the inner side walls on two sides of the lower regions of the first trenches 111. The dielectric layers 122 are formed, such that the dielectric layers 122 cover the side wall surfaces on two sides of the body portions 1211 formed subsequently.

When the dielectric material layers 1221 positioned at the bottoms of the first trenches 111 are etched, the etching time may be slightly prolonged to ensure that the dielectric material layers 1221 covering the bottoms of the first trenches 111 are completely removed.

S230: forming isolation layers, where the isolation layers are positioned in the first trenches.

Figure 17A:
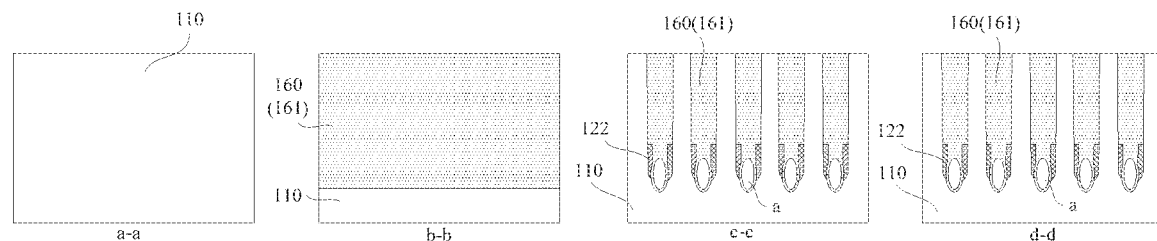
FIG. 17*a* is a sectional view of forming an isolation layer in the substrate in FIG. 2.
Figure 17B:
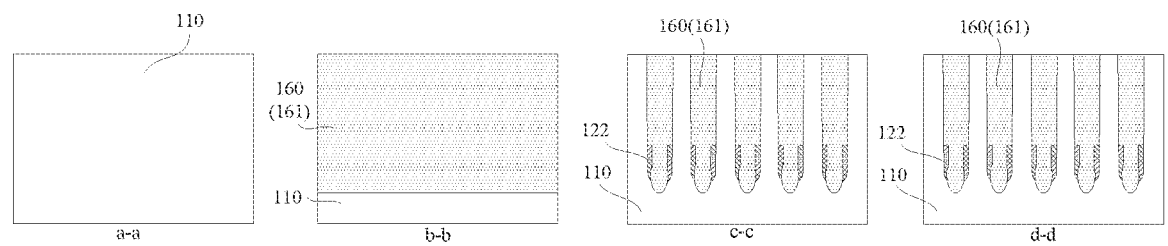
FIG. 17*b* is a sectional view of forming another isolation layer in the substrate in FIG. 2.

FIG. 17a is a sectional view of forming an isolation layer in the substrate in FIG. 2; and FIG. 17b is a sectional view of forming another isolation layer in the substrate in FIG. 2. Referring to FIG. 17a or FIG. 17b, after the dielectric layers 122 are formed in the first trenches 111, the isolation layers 161 are then deposited and formed in the first trenches 111, where the isolation layers 161 completely fill the first trenches 111, and the isolation layers 161 are the isolation structures 160 between the adjacent bit lines 120. For example, an isolation material constituting the isolation layers 161 is, for example, $SiO_2$, and $SiO_2$ may be deposited in the first trenches 111 by means of the CVD process.

At this moment, body structures of the bit lines 120, namely initial structures of the body portions 1211 of the bit lines 120 and the dielectric layers 122 covering two sides of the body portions 1211 are fabricated. After the isolation layers 161 are deposited and formed, the top surface of the substrate 110 is leveled. For example, the top surface of the substrate 110 may be polished smoothly by means of a chemical mechanical polishing (CMP) process.

Referring to FIG. 17a, as an embodiment, the air gap a is provided between the bottoms of the isolation layers 161 formed and the bottoms of the first trenches 111. In this way, on the basis of the dielectric layers 122, the air gap a may further enhance the isolation effect between the adjacent bit lines 120. Moreover, the air gap a may absorb stress in the substrate 110, reduce lattice defects in the structural layers of the substrate 110, and improve the performance of the DRAM.

Because the dielectric layers 122 cover the side walls on two sides of the lower regions of the first trenches 111, the dielectric layers 122 reduce trench widths of the first trenches 111 in the regions, and deposition speed of the isolation material may be accelerated to form the air gap a between the bottoms of the first trenches 111 and the isolation layers 161.

Referring to FIG. 17b, as another embodiment, there may be no air gap a between the bottoms of the isolation layers 161 formed and the bottoms of the first trenches 111. Depending on the dielectric layers 122 covering the side walls on two sides of the lower regions of the first trenches 111, requirements for isolation between the bit lines 120 may be satisfied. The deposition uniformity of the isolation material may be improved by reducing the deposition rate of the isolation material, such that the isolation material completely fills the bottom regions of the first trenches 111.

The following description will be given by taking an example where the isolation layers 161 formed in the first trenches 111 have the air gap a.

Figure 18:
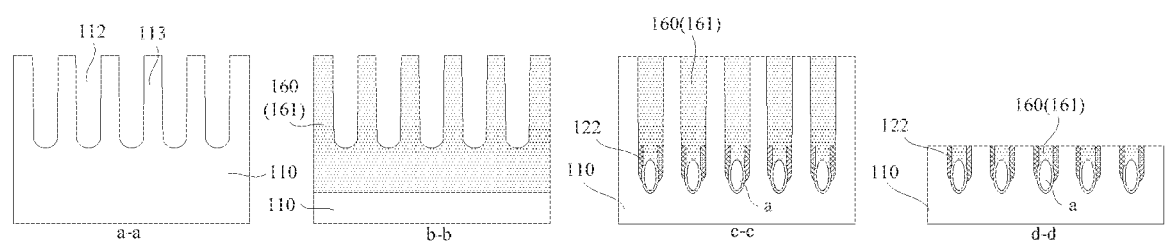
FIG. 18 is a sectional view of forming a second trench in the substrate in FIG. 2.
Figure 19:
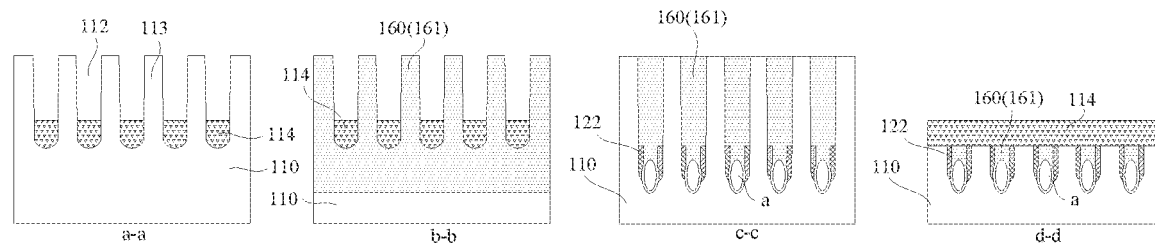
FIG. 19 is a sectional view of forming a metal layer in the substrate in FIG. 2.
Figure 20:
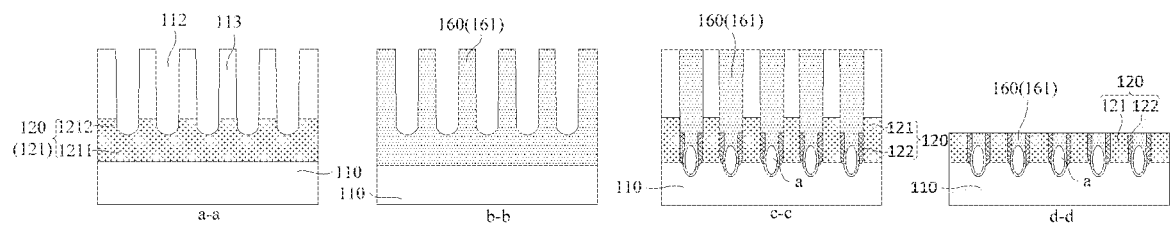
FIG. 20 is a sectional view of forming a bit line in the substrate in FIG. 2.
Figure 21:
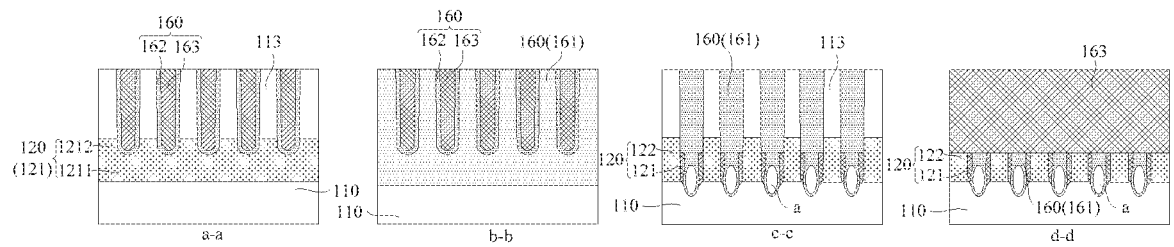
FIG. 21 is a sectional view of forming a silicon oxide layer and a silicon nitride layer in the substrate in FIG. 2.

FIG. 18 is a sectional view of forming a second trench in the substrate in FIG. 2; FIG. 19 is a sectional view of forming a metal layer in the substrate in FIG. 2; FIG. 20 is a sectional view of forming a bit line in the substrate in FIG. 2; and FIG. 21 is a sectional view of forming a silicon oxide layer and a silicon nitride layer in the substrate in FIG. 2.

S240: forming a second trench, where the second trench is positioned in the substrate and extends along a second direction, and a bottom of the second trench is flush with a top of the dielectric layer; the second direction intersects with the first direction, and the substrate positioned between the first trench and the second trench forms a columnar structure.

Referring to FIG. 18, after the isolation layers 161 are formed in the first trenches 111, the second trenches 112 are etched along the second direction (the extension direction of the word lines 130) in the substrate 110. That is, the second trenches 112 are etched along the direction X shown in FIG. 2. By controlling the etching speed and etching time, the bottoms of the second trenches 112 are flush with the tops of the dielectric layers 122.

In this way, on a plane where the tops of the dielectric layers 122 are positioned, the substrate 110 forms a plurality of columnar structures arranged at intervals along the extension direction (the first direction) of the bit lines 120. The columnar structures are positioned in a region defined by the first trenches 111 and the second trenches 112, and the columnar structures are initial semiconductor pillars 113. The substrate 110 positioned in the thickness region of the dielectric layers 122 is configured to form the body portions 1211 of the conductive bodies 121 of the bit lines 120. In the semiconductor pillars 113, a height region from the bottoms of the semiconductor pillars 113 is configured to form the contact portions 1212 of the conductive bodies 121, and other regions of the semiconductor pillars 113 may be configured to form the active pillars 141.

S250: forming a metal layer, where the metal layer is positioned in the second trench.

Referring to FIG. 19, after the second trenches 112 are etched and formed in the substrate 110, the metal layers 114 are then deposited in the second trenches 112. For example, the metal layers 114 may be deposited in the second trenches 112 by means of the PVD process, and the metal layers 114 are configured to penetrate into the substrate 110 around the second trenches 112 to form the conductive bodies 121 needed finally.

For example, the metal material constituting the metal layers 114 may be tungsten or aluminum.

In the process of depositing the metal material in the second trenches 112, the filling height of the metal material may be higher than the actual required height, and even if the metal material fills up the second trenches 112, the surfaces of the metal layers 114 are not flat, which influences the uniformity of the conductive bodies 121 formed subsequently. Therefore, after the metal layers 114 are deposited, the metal layers 114 in the second trenches 112 may be cleaned with the etchant, to reduce the height of the metal layers 114 and improve the surface flatness of the metal layers 114, such that the metal layers 114 meet the structure and performance requirements of the conductive bodies 121. For example, the etchant may be a mixed solution of $H_2O_2$ and HCl.

S260: processing the metal layer and the substrate to form the bit lines in the substrate.

Referring to FIG. 20, after the metal layers 114 are formed in the second trenches 112, the metal layers 114 and the substrate 110 need to be heated, such that the metal layers 114 penetrate into the substrate 110 to form metal silicides, and a region where the metal silicides are positioned in the substrate 110 forms the conductive bodies 121 of the bit lines 120.

The metal layers 114 penetrate into the surrounding substrate 110 from the inner wall surfaces of the adjacent second trenches 112. The metal layers 114 diffuse from the bottom regions of the second trenches 112 into the substrate 110 below the second trenches 112 to form the body portions 1211 of the conductive bodies 121, and the metal layers 114 diffuse horizontally from the side wall regions of the second trenches 112 into the semiconductor pillars 113 to form the contact portions 1212 of the conductive bodies 121.

In some embodiments, the metal layers 114 and the substrate 110 may be treated by means of the annealing process, such that metal particles in the metal layers 114 penetrate into the substrate 110 to form the metal composite layers, namely the aforementioned metal silicide layers, to form the conductive bodies 121 of the bit lines 120 in the substrate 110. The annealing temperature may be between 300° C. and 800° C. For example, the annealing temperature is 400° C., 450° C., 500° C., 550° C., 600° C., 650° C., 700° C., 750° C., or 800° C.

After the heat treatment process is completed, for the metal particles that do not penetrate into the substrate 110, namely the metal layers 114 remaining in the second trenches 112, the metal material remaining in the second trenches 112 may be removed by means of the etching process to prevent the remaining metal material from influencing the isolation performance between the bit lines 120. For example, the mixed solution of $H_2O_2$ and HCl may be used as the etchant to etch and remove the metal material remaining in the second trenches 112.

Referring to FIG. 21, after the bit lines 120 are formed, an isolation material may be filled in the second trenches 112 to form the isolation structures 160 in the second trenches 112. The semiconductor pillars 113 are isolated from each other by means of the isolation layers 161 between the bit lines 120 and the isolation structures 160 in the second trenches 112.

The isolation structure 160 formed in the second trench 112 may include a silicon oxide layer 162 and a silicon nitride layer 163. The silicon oxide layer 162 may be deposited in the second trench 112 first, and the silicon oxide layer 162 covers an inner wall surface of the second trench 112. Next, the silicon nitride layer 163 is deposited in the second trench 112, where the silicon nitride layer 163 covers the silicon oxide layer 162, and completely fills the second trench 112.

S300: forming transistors, where the transistors are formed on top surfaces of the plurality of contact portions facing away from the body portion, and extension directions of channels of the transistors are perpendicular to a plane where the substrate is positioned.

Referring to FIG. 3, after the isolation structures 160 are formed in the second trenches 112, the transistors 140 may be formed in the substrate 110. In some embodiments, the semiconductor pillars 113 may be doped first, such that the semiconductor pillars 113 form the active pillars 141. Next, the gate structures 142 surrounding the circumferential sides of the active pillars 141 are formed in the substrate 110.

Taking an example where the substrate 110 is an N-type doped silicon substrate, the active pillars 141 may be formed by performing P-type doping on the semiconductor pillars 113. For example, referring to FIG. 3, in the upward direction from the substrate 110, the active pillars 141 may include the sources 1411, the channels, and the drains 1412 arranged in sequence; or, the active pillars 141 include the drains 1412, the channels, and the sources 1411 arranged in sequence.

In addition, the gate structures 142 formed surrounding the circumferential sides of the active pillars 141 may include the gate insulating layers 1421 and the gates sequentially stacked on the outer wall surfaces of the parts where the channels of the active pillars 141 are positioned. The gate insulating layers 1421 may be formed first, where the gate insulating layers 1421 wrap at least part of the regions of the channels in the circumferential direction. Next, the gates are formed, where the gates wrap outside the gate insulating layers 1421.

Referring to FIG. 3, after the transistors 140 are formed, the method further includes forming the word lines 130 in the substrate 110. The word lines 130 may extend along the second direction, the word lines 130 may be positioned within the height interval where the active pillars 141 are positioned, the word lines 130 surround at least part of the regions of the transistors 140 in the circumferential direction, and the word lines 130 are in contact with the gates.

After the word lines 130 are formed, the contact plugs 151 may be formed on the top surface of the substrate 110. The contact plugs 151 are in one-to-one correspondence with the active pillars 141, and the bottom surfaces of the contact plugs 151 are in contact with the top surfaces of the active pillars 141. Next, the capacitors are formed on the contact plugs 151, and the capacitors are electrically connected to the active pillars 141 by means of the contact plugs 151.

In the description of the present disclosure, it is to be understood that the orientations or positions represented by the terms of "center", "longitudinal", "transverse", "length", "width", "thickness", "up", "down", "front", "back", "left", "right", "vertical", "horizontal", "top", "bottom", "in", "out", and the like are based on the orientations or positions as shown in the accompanying figures, they are merely for ease of a description of the present disclosure and a simplified description instead of being intended to indicate or imply the device or element to have a special orientation or to be configured and operated in a special orientation. Thus, they cannot be understood as limiting of the present disclosure.

In the description of the present disclosure, it is to be understood that the terms "comprise", "have" or any other variants thereof used herein are intended to cover a non-exclusive inclusion, for example, processes, methods, systems, products or devices comprising a series of steps or units are not limited to these steps or units listed explicitly, but comprise other steps or units not listed explicitly, or other steps or units inherent to these processes, methods, systems, products or devices.

Unless specified or limited otherwise, terms "mounted", "connected", "coupled", "fixed" and so on should be understood in a broad sense, which may be, for example, a fixed connection, a detachable connection or integrated connection, a direct connection or indirect connection by means of an intermediary, an internal communication between two components or an interaction relationship between two components. For those of ordinary skill in the art, concrete meanings of the above terms in the present disclosure may be understood based on concrete circumstances. In addition, terms "first" and "second" are used only for purposes of description and are not intended to indicate or imply relative importance or to imply the number of indicated technical features.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A semiconductor structure, comprising:
a substrate;
bit lines positioned in the substrate, each of the bit lines comprising a conductive body and a sidewall layer, the conductive body comprising a body portion and a plurality of contact portions, the body portion extending along a first direction, the plurality of contact portions protruding from a side surface of the body portion facing away from a bottom of the substrate, the plurality of contact portions being arranged at intervals along the first direction, and the sidewall layer covering side wall surfaces on left and right sides of the body portion along an extension direction; and
transistors positioned on top surfaces of the plurality of contact portions facing away from the body portion, extension directions of channels of the transistors being perpendicular to a plane where the substrate is positioned;
wherein the sidewall layer is a conductor layer.

2. The semiconductor structure according to claim 1, wherein the plurality of contact portions and the body portion are integrally formed structures.

3. The semiconductor structure according to claim 1, wherein an air gap is provided between adjacent two of the bit lines.

4. The semiconductor structure according to claim 1, wherein
the sidewall layer is a composite layer, the composite layer comprising a conductor layer and an insulating layer sequentially stacked on the side wall surfaces of the body portion.

5. The semiconductor structure according to claim 1, wherein the transistors comprise:
active pillars positioned on the top surfaces of the plurality of contact portions, extension directions of the active pillars being perpendicular to the plane where the substrate is positioned;
gates surrounding at least part of circumferential sides of the active pillars; and
gate insulating layers positioned between outer side walls of the active pillars and the gates.

6. The semiconductor structure according to claim 5, further comprising:
word lines positioned on sides of the bit lines facing away from the bottom of the substrate and extending along a second direction, the word lines surrounding at least part of regions in circumferential directions of the transistors and being electrically connected to the gates;
wherein the second direction intersects with the first direction.

7. The semiconductor structure according to claim 1, further comprising:
contact plugs positioned on top surfaces of the transistors facing away from the bit lines; and
capacitors positioned on top surfaces of the contact plugs facing away from the transistors.

8. A method for fabricating a semiconductor structure, comprising:
providing a substrate; and
forming bit lines, the bit lines being formed in the substrate, each of the bit lines comprising a conductive body and a sidewall layer, the conductive body comprising a body portion and a plurality of contact portions, the body portion extending along a first direction, the plurality of contact portions protruding from a side surface of the body portion facing away from a bottom of the substrate, the plurality of contact portions being arranged at intervals along the first direction, and the sidewall layer covering side wall surfaces on left and right sides of the body portion along an extension direction; and
forming transistors, the transistors being formed on top surfaces of the plurality of contact portions facing away from the body portion, and extension directions of channels of the transistors being perpendicular to a plane where the substrate is positioned;
wherein the sidewall layer is a conductor layer.

9. The method for fabricating the semiconductor structure according to claim 8, wherein
the forming the bit lines comprises:
forming a first trench, the first trench being positioned in the substrate and extending along the first direction;
forming a sidewall layer, the sidewall layer covering an inner wall surface of a lower region of the first trench and exposing the substrate at a bottom of the first trench;
forming an isolation layer, the isolation layer being positioned in the first trench;
forming a second trench, the second trench being positioned in the substrate and extending along a second direction, and a bottom of the second trench being flush with a top of the sidewall layer; wherein the second direction intersects with the first direction, and the substrate positioned between the first trench and the second trench forms a columnar structure;
forming a metal layer, the metal layer being positioned in the second trench; and
processing the metal layer and the substrate to form bit lines in the substrate.

10. The method for fabricating the semiconductor structure according to claim 9, wherein
the forming the sidewall layer comprises:
forming a sidewall material layer, the sidewall material layer covering an inner wall surface of the first trench;
forming an initial isolation layer, the initial isolation layer being positioned in the first trench and covering the sidewall material layer;
removing the initial isolation layer by part of a height;
removing the sidewall material layer exposed above the initial isolation layer;
removing a remaining part of the initial isolation layer; and
removing a remaining part of the sidewall material layer covering the bottom of the first trench to form the sidewall layer.

11. The method for fabricating the semiconductor structure according to claim 10, wherein after removing the initial isolation layer by part of the height, the height of the remaining part of the initial isolation layer accounts for $\frac{1}{10}$ to $\frac{1}{2}$ of a depth of the first trench.

12. The method for fabricating the semiconductor structure according to claim 9, wherein the forming the isolation layer comprises:

forming the isolation layer, an air gap being provided between the isolation layer and the bottom of the first trench.

13. The method for fabricating the semiconductor structure according to claim 9, wherein the processing the metal layer and the substrate comprises:

processing the metal layer and the substrate by means of an annealing process, such that metal particles of part of the metal layer penetrate into the substrate to form a metal composite layer, wherein the metal composite layer forms the bit lines; and removing the metal layer not penetrating into the substrate.

14. The method for fabricating the semiconductor structure according to claim 9, wherein after forming the bit lines and before forming the transistors, the method further comprises:

forming a silicon oxide layer, the silicon oxide layer covering an inner wall surface of the second trench; and forming a silicon nitride layer, the silicon nitride layer being positioned in the second trench and covering the silicon oxide layer.

\* \* \* \* \*